(12) United States Patent
Tian et al.

(10) Patent No.: US 10,903,444 B2
(45) Date of Patent: Jan. 26, 2021

(54) OLED PACKAGE SUBSTRATE HAVING A CONDUCTOR ATTACHED TO ELECTRODE ON AN ARRAY SUBSTRATE

(71) Applicant: BOE TECHNOLOGY GROUP CO., LTD., Beijing (CN)

(72) Inventors: Hongwei Tian, Beijing (CN); Yanan Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 15/755,034

(22) PCT Filed: Jul. 11, 2017

(86) PCT No.: PCT/CN2017/092478
§ 371 (c)(1),
(2) Date: Feb. 23, 2018

(87) PCT Pub. No.: WO2018/049891
PCT Pub. Date: Mar. 22, 2018

(65) Prior Publication Data
US 2020/0235329 A1 Jul. 23, 2020

(30) Foreign Application Priority Data

Sep. 13, 2016 (CN) .......................... 2016 1 0822682

(51) Int. Cl.
*H01L 29/08* (2006.01)
*H01L 33/00* (2010.01)
(Continued)

(52) U.S. Cl.
CPC ........ *H01L 51/5228* (2013.01); *H01L 21/682* (2013.01); *H01L 27/3246* (2013.01);
(Continued)

(58) Field of Classification Search
CPC ............. H01L 51/5228; H01L 51/5212; H01L 51/5253; H01L 51/56; H01L 27/3246; H01L 21/682
See application file for complete search history.

(56) References Cited

U.S. PATENT DOCUMENTS

| | | | |
|---|---|---|---|
| 6,608,449 B2 * | 8/2003 | Fukunaga | ........... H01L 27/3244 313/494 |
| 8,354,980 B2 * | 1/2013 | Kwak | ................... H01L 27/322 313/506 |

(Continued)

FOREIGN PATENT DOCUMENTS

| CN | 103531717 A | 1/2014 |
|---|---|---|
| CN | 103545345 A | 1/2014 |

(Continued)

OTHER PUBLICATIONS

International Search Report received for PCT Patent Application No. PCT/CN2017/092478, dated Oct. 24, 2017, 6 pages (2 pages of English Translation and 4 pages of Original Document).

(Continued)

*Primary Examiner* — Alonzo Chambliss
(74) *Attorney, Agent, or Firm* — Womble Bond Dickinson (US) LLP

(57) ABSTRACT

Embodiments of the present disclosure provide an OLED package substrate, a manufacturing method thereof, and an OLED display panel. The OLED package substrate comprises a display area and a non-display area, the display area comprising a pixel definition area. The OLED package substrate comprises a base substrate, and a conductor on the base substrate and within the pixel definition area. The conductor is configured to be in contact with a cathode or an anode at a surface of an array substrate for assembly with the OLED package substrate.

14 Claims, 4 Drawing Sheets

(51) Int. Cl.
*H01L 31/0232* (2014.01)
*H01L 23/544* (2006.01)
*H01L 21/00* (2006.01)
*H01L 51/40* (2006.01)
*H01L 51/52* (2006.01)
*H01L 27/32* (2006.01)
*H01L 51/56* (2006.01)
*H01L 21/68* (2006.01)

(52) U.S. Cl.
CPC ...... *H01L 51/5212* (2013.01); *H01L 51/5253* (2013.01); *H01L 51/56* (2013.01)

(56) References Cited

U.S. PATENT DOCUMENTS

| | | | | |
|---|---|---|---|---|
| 9,978,994 | B2* | 5/2018 | Shen | H01L 51/5228 |
| 10,177,335 | B2* | 1/2019 | Yamazaki | H01L 51/5212 |
| 2001/0043046 | A1* | 11/2001 | Fukunaga | H01L 51/525 |
| | | | | 315/160 |
| 2010/0097295 | A1* | 4/2010 | Kwak | H01L 51/5284 |
| | | | | 345/32 |
| 2010/0258346 | A1* | 10/2010 | Chen | H01L 51/525 |
| | | | | 174/521 |
| 2012/0097990 | A1* | 4/2012 | Koh | H01L 27/3244 |
| | | | | 257/88 |
| 2015/0243926 | A1 | 8/2015 | Deng et al. | |
| 2016/0035980 | A1 | 2/2016 | Kong et al. | |
| 2016/0043343 | A1 | 2/2016 | Zhang | |
| 2016/0202563 | A1 | 7/2016 | Lu et al. | |
| 2016/0248043 | A1 | 8/2016 | Liu et al. | |
| 2016/0276619 | A1* | 9/2016 | Cheng | H01L 51/56 |

FOREIGN PATENT DOCUMENTS

| | | |
|---|---|---|
| CN | 103794637 A | 5/2014 |
| CN | 203721729 U | 7/2014 |
| CN | 104078491 A | 10/2014 |
| CN | 104156110 A | 11/2014 |
| CN | 104157798 A | 11/2014 |
| CN | 106129102 A | 11/2016 |

OTHER PUBLICATIONS

Written Opinion received for PCT Patent Application No. PCT/CN2017/092478, dated Oct. 24, 2017, 6 pages (2 pages of English Translation and 4 pages of Original Document).

Office Action received for Chinese Patent Application No. 201610822682.3, dated Jun. 26, 2018, 16 pages (9 pages of English Translation and 7 pages of Office Action).

* cited by examiner

OLED PACKAGE SUBSTRATE HAVING A CONDUCTOR ATTACHED TO ELECTRODE ON AN ARRAY SUBSTRATE

RELATED APPLICATION

The present application is the U.S. national phase entry of PCT/CN2017/092478, with an international filing date of Jul. 11, 2017, which claims the benefit of Chinese Patent Application No. 201610822682.3, filed on Sep. 13, 2016, the entire disclosure of which is incorporated herein by reference as a part of the present application.

FIELD

The present disclosure relates to the field of display technology, and particularly to an OLED package substrate, a manufacturing method thereof, and an OLED display panel.

BACKGROUND

At present, organic light emitting diode (OLED) display devices have been more and more widely used due to their characteristics such as being self-luminous, having a wide viewing angle and a fast response speed, capable of being flexible, and the like.

In OLED display devices, the top emission structure is the most commonly used structure. A structure of an OLED display device may include, for example, a metal anode, a metal cathode, and an organic material functional layer located therebetween. The organic material functional layer includes a light emitting layer. Taking the case where the metal cathode is disposed at a light emergent side of the OLED display device as an example, light emitted by the light emitting layer would be emitted from the cathode side. In order to reduce the loss of emergent light, in general, the thickness of a metal layer for making the cathode is just a few nanometers to several tens of nanometers. In most cases, the thickness of the metal layer for making the cathode is 20 nm or less.

It can be seen that, due to the small thickness of the cathode, the cathode often becomes a portion with the largest resistance in the entire OLED display device. During a process of driving the OLED display device to emit light, there is a large voltage drop across the large resistance of the cathode portion. According to the electric power formula $P=I^2R$, the cathode portion consumes a large amount of power under a fixed current, causing an increase in the power consumption of the OLED display device. As a result, the cathode generates heat and thus affects the operation of the OLED display device, resulting in poor characteristics and shortened lifetime of the OLED display device.

SUMMARY

According to an aspect, an embodiment of the present disclosure provides an OLED package substrate. The OLED package substrate comprises a display area and a non-display area, the display area comprising a pixel definition area. The OLED package substrate comprises: a base substrate, and a conductor on the base substrate and within the pixel definition area. The conductor is configured to be in contact with a cathode or an anode at a surface of an array substrate for assembly with the OLED package substrate.

According to another embodiment, the conductor comprises: an auxiliary electrode pattern; and a connection structure which is disposed on and in contact with the auxiliary electrode pattern. The connection structure is configured to be in contact with the cathode or anode.

According to another embodiment, the OLED package substrate further comprises an alignment pattern in the non-display area. The alignment pattern and the auxiliary electrode pattern are located in the same layer and formed of the same material.

According to another embodiment, the display area further comprises a plurality of sub-pixel areas defined by the pixel definition area, and the auxiliary electrode pattern is of a mesh structure, each mesh in the mesh structure corresponding to one sub-pixel area.

According to another embodiment, the display area further comprises a plurality of sub-pixel areas defined by the pixel definition area, and the auxiliary electrode pattern includes a plurality of sub-auxiliary electrode patterns, each sub-auxiliary electrode pattern enclosing one sub-pixel area.

According to another embodiment, the OLED package substrate further comprises a protective layer covering the auxiliary electrode pattern, wherein a via hole is disposed in the protective layer, and the connection structure comes into contact with the auxiliary electrode pattern through the via hole in the protective layer.

According to another embodiment, the display area further comprises a plurality of sub-pixel areas defined by the pixel definition area, and the auxiliary electrode pattern is of a mesh structure, each mesh in the mesh structure corresponding to one sub-pixel area. The OLED package substrate further comprises a protective layer covering the auxiliary electrode pattern, and a plurality of via holes are disposed in the protective layer over the auxiliary electrode pattern that encloses each mesh. The connection structure comprises multiple connection posts, each connection post is in contact with the auxiliary electrode pattern through a corresponding via hole, and the auxiliary electrode pattern that encloses each mesh is in contact with the cathode or anode at the surface of the array substrate via corresponding multiple connection posts.

According to another embodiment, the display area further comprises a plurality of sub-pixel areas defined by the pixel definition area, and the auxiliary electrode pattern includes a plurality of sub-auxiliary electrode patterns, each sub-auxiliary electrode pattern enclosing one sub-pixel area. The OLED package substrate further comprises a protective layer covering the auxiliary electrode pattern, and a plurality of via holes are disposed in the protective layer over each sub-auxiliary electrode pattern. The connection structure comprises multiple connection posts, each connection post is in contact with a corresponding sub-auxiliary electrode pattern through a corresponding via hole, and each sub-auxiliary electrode pattern is in contact with the cathode or anode at the surface of the array substrate via corresponding multiple connection posts.

According to another embodiment, a height of the connection structure is 0.05 μm to 100 μm.

According to another embodiment, the connection structure is formed of a transparent conductive material.

According to another aspect, an embodiment of the present disclosure provides an OLED display panel comprising a package substrate and an array substrate assembled with each other, wherein the array substrate comprises a cathode or an anode formed at a surface thereof, and the package substrate is the OLED package substrate described above.

According to a further aspect, an embodiment of the present disclosure provides a method of manufacturing an OLED package substrate, the OLED package substrate comprising a display area and a non-display area, the display area comprising a pixel definition area. The method comprises: providing a base substrate; and forming a conductor on the base substrate. The conductor is within the pixel definition area, and the conductor is configured to be in contact with a cathode or anode at a surface of an array substrate for assembly with the OLED package substrate.

According to another embodiment, the conductor comprises: an auxiliary electrode pattern; and a connection structure which is disposed on and in contact with the auxiliary electrode pattern. Forming a conductor on the base substrate comprises: forming a metal thin film on the base substrate, forming an auxiliary electrode pattern within the pixel definition area of the display area by patterning process, and forming a connection structure on the auxiliary electrode pattern by patterning process.

According to another embodiment, the method of manufacturing an OLED package substrate further comprises: forming an alignment pattern within the non-display area while forming the auxiliary electrode pattern within the pixel definition area of the display area by patterning process.

According to another embodiment, the method of manufacturing an OLED package substrate further comprises: after forming the auxiliary electrode pattern within the pixel definition area of the display area by patterning process and forming the alignment pattern in the non-display area, forming a protective layer over the alignment pattern and the auxiliary electrode pattern, wherein a via hole that exposes a portion of the auxiliary electrode pattern is disposed in the protective layer. Forming a connection structure on the auxiliary electrode pattern by patterning process comprises: forming a conductive thin film on the protective layer, and forming a connection structure on the auxiliary electrode pattern by patterning process, the connection structure being in contact with the auxiliary electrode pattern through the via hole in the protective layer.

BRIEF DESCRIPTION OF DRAWINGS

To illustrate embodiments of the present disclosure more clearly, the accompanying drawings required for describing the embodiments will be briefly introduced below. Obviously, the drawings in the description below are merely some embodiments of the present disclosure. For those ordinarily skilled in the art, other drawings may also be obtained based on these drawings without spending inventive efforts.

DETAILED DESCRIPTION

Technical solutions in embodiments of the present disclosure will be clearly and completely described below with reference to the accompanying drawings in the embodiments of the present disclosure. Obviously, the described embodiments are merely a part but not all of the embodiments of the present disclosure. All other embodiments obtained by those ordinarily in the art based on the embodiments of the present disclosure without spending inventive efforts fall within the protection scope of the present disclosure.

As described above, in an existing OLED display device, the cathode tends to become a portion with the largest resistance in the entire OLED display device. The inventors have found from research that, since the cathode at a surface of the array substrate in the OLED display device is usually in a form of an electrode with a relatively large area, when a voltage is applied at one end of the cathode, the current generated all over the cathode with a relatively large area would produce great power consumption due to the resistance of the cathode. Moreover, due to the resistance generated by the cathode with a relatively large area, when a voltage is applied at one end of the cathode, the voltage generated at the other end of the cathode often differs from the applied voltage. In addition, this problem also arises in the case where the anode with a relatively large area is located at a surface of the array substrate.

In view of this cognition, the inventors propose an OLED package substrate. The OLED package substrate comprises a display area and a non-display area. The display area comprises a pixel definition area. The OLED package substrate may comprise a base substrate, and a conductor on the base substrate and in the pixel definition area. The conductor is configured to be in contact with a cathode or an anode at a surface of an array substrate for assembly with the OLED package substrate.

Since the conductor is disposed on the OLED package substrate, when the OLED package substrate is assembled with the array substrate, the conductor can contact the anode or cathode located at the surface of the array substrate. This gives a resistor in parallel to the anode or cathode located at the surface of the array substrate. As a result, the resistance of the anode or cathode located at the surface of the array substrate is reduced, thereby avoiding the large power consumption caused by the anode or cathode. This can reduce the overall power consumption of the OLED display device, improve the characteristics of the OLED display device, and prolong the service lifetime thereof.

Figure 1:
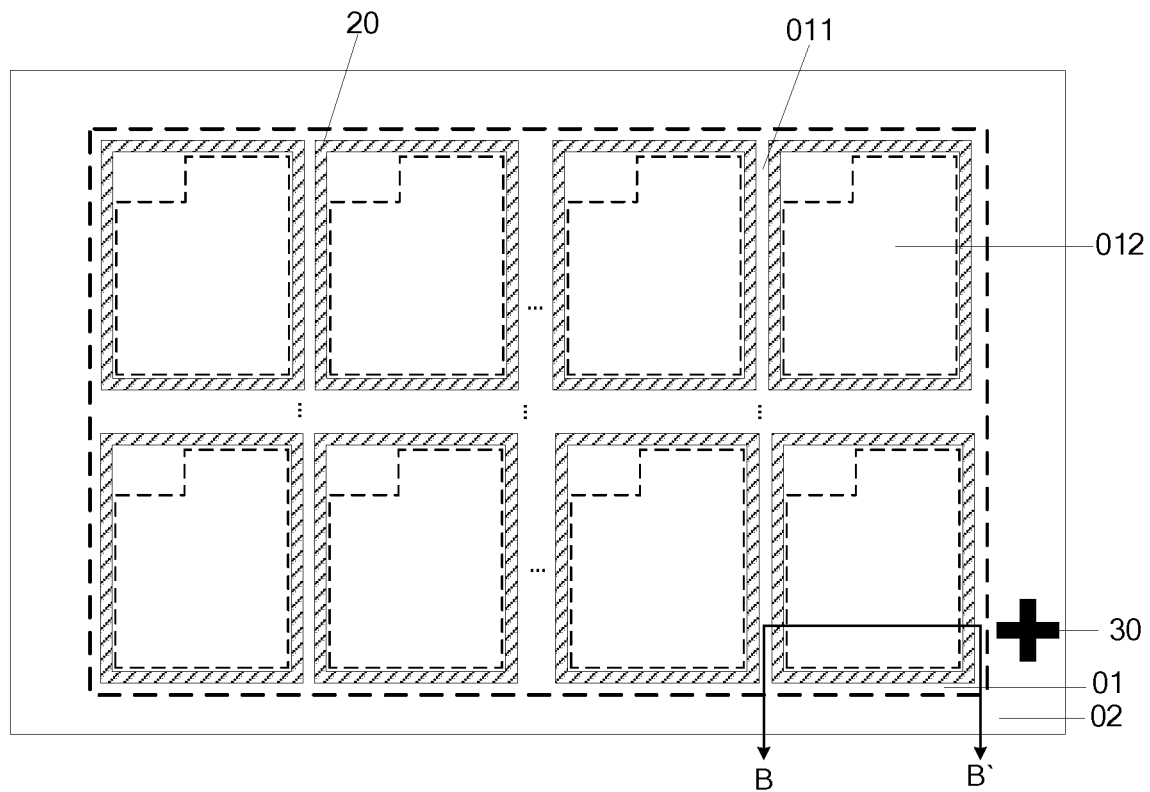
FIG. 1 is a schematic view showing a planar structure of an OLED package substrate provided by embodiments of the present disclosure.
Figure 2:
FIG. 2 is a schematic sectional view taken along a direction BB' in FIG. 1.

More specifically, embodiments of the present disclosure provide an OLED package substrate. As shown in FIG. 1, the OLED package substrate comprises a display area 01 and a non-display area 02. The display area (or, active area (AA)) 01 comprises a pixel definition area 011. As shown in FIG. 1 and FIG. 2, the OLED package substrate comprises:

a base substrate 10; and a conductor 20 disposed on the base substrate 10 and located in the pixel definition area 011. The conductor 20 is configured to be in contact with a cathode or an anode located at a surface of an array substrate for assembly with the OLED package substrate.

It is to be noted that, firstly, the display area 01 of the OLED package substrate, the non-display area 02 thereof, the pixel definition area 011 thereof, and a sub-pixel area 012 defined by the pixel definition area 011 are all divided according to corresponding areas of the array substrate for assembly with the OLED package substrate, or divided according to corresponding areas of an OLED display panel comprising the OLED package substrate and the array substrate. There is no physical boundary for these areas on the OLED package substrate.

Secondly, the type of the array substrate for assembly with the OLED package substrate is not limited. The array substrate may be a Passive Matrix Driving OLED (PMOLED) array substrate or a Active Matrix Driving OLED (AMOLED) array substrate. When the array substrate for assembly with the OLED package substrate is a PMOLED array substrate, an electrode at the surface of the array substrate may be an anode or a cathode. When the array substrate for assembly with the OLED package substrate is an AMOLED array substrate, the electrode at the surface of the array substrate is typically a cathode.

Thirdly, the pixel definition area 011 is an area to which a pixel definition layer on the array substrate for assembly with the OLED package substrate corresponds. That is, the pixel definition area 011 corresponds to a non-light emitting area in a display area of the array substrate.

Fourthly, the shape and size of the conductor 20 are not limited, as long as the conductor 20 can contact the cathode or anode located at the surface of the array substrate for assembly with the OLED package substrate. The conductor 20 may enclose the sub-pixel area 012 defined by the pixel definition area 011, or may not enclose the sub-pixel area 012. FIG. 1 illustrates the case where the conductor 20 encloses the sub-pixel area 012. The material of the conductor 20 is not limited, as long as the material can reduce the resistance of the anode or cathode located at the surface of the array substrate after the conductor 20 contacts the anode or cathode.

Fifthly, the material of the base substrate 10 is not limited. It should be understood by those skilled in the art that, for a top emission type OLED display device, in order not to affect normal emission of the light emitted by a light emitting layer, the OLED package substrate should be transparent. The base substrate 10 may also be transparent. For example, the base substrate 10 may be made of glass.

An embodiment of the present disclosure provides an OLED package substrate. Since the conductor 20 is disposed on the OLED package substrate, when the OLED package substrate is assembled with the array substrate, the conductor 20 can contact the anode or cathode located at the surface of the array substrate. This gives a resistor in parallel to the anode or cathode located at the surface of the array substrate. As a result, the resistance of the anode or cathode located at the surface of the array substrate is reduced, thereby avoiding the large power consumption caused by the anode or cathode. This can reduce the overall power consumption of the OLED display device, improve the characteristics of the OLED display device and prolong the service lifetime thereof.

Figure 3:
FIG. 3 is a schematic structural view of another OLED package substrate provided by embodiments of the present disclosure.

According to another embodiment, as shown in FIG. 3, the conductor 20 comprises an auxiliary electrode pattern 201; and a connection structure 202 disposed on and in contact with the auxiliary electrode pattern 201. The connection structure 202 is configured to be in contact with the cathode or anode at the surface of the array substrate for assembly with the OLED package.

The shape and size of the auxiliary electrode pattern 201 are not limited. The shape of the auxiliary electrode pattern 201 may be, for example, a shape made up of a plurality of hexagons, a plurality of stars, a plurality of circles, or a plurality of other irregular shapes.

In addition, the material of the auxiliary electrode pattern 201 is not limited as long as the resistance of the anode or cathode of the array substrate can be reduced after the auxiliary electrode pattern 201 contacts the anode or cathode. The material of the auxiliary electrode pattern 201 may be a material with a smaller resistance. In this way, after the auxiliary electrode pattern 201 contacts the anode or cathode at the surface of the array substrate via the connection structure 202, the resistance of the anode or cathode can be greatly reduced.

Exemplarily, the material of the auxiliary electrode pattern 201 may be at least one selected from the group comprising a metal element, a metal oxide and an alloy. The metal element may be, for example, Mo (molybdenum), Al (aluminum), Ag (silver), Cu (copper) or the like.

The material of the connection structure 202 is not limited. Since the conductive resin is transparent and has a smaller resistance, the material of the connection structure 202 may be a conductive resin. As for the height of the connection structure 202, the connection structure 202 may contact the anode or cathode located at the surface of the array substrate at least after the OLED package substrate is assembled with the array substrate.

In this embodiment, the auxiliary electrode pattern 201 is connected to the anode or cathode located at the surface of the array substrate via the connection structure 202. After the auxiliary electrode pattern 201 is connected to the anode or cathode located at the surface of the array substrate, the resistance of the anode or cathode can be reduced.

Figure 4A:
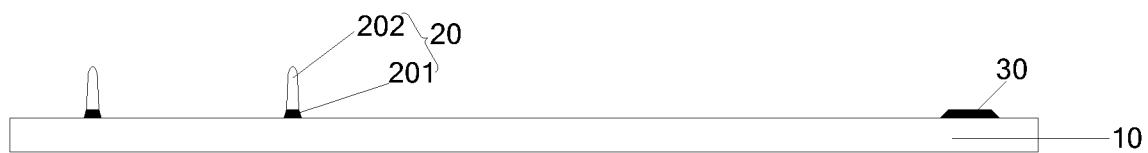
FIG. 4A is a schematic structural view of another OLED package substrate comprising an alignment pattern and a conductor as provided by embodiments of the present disclosure.
Figure 4B:
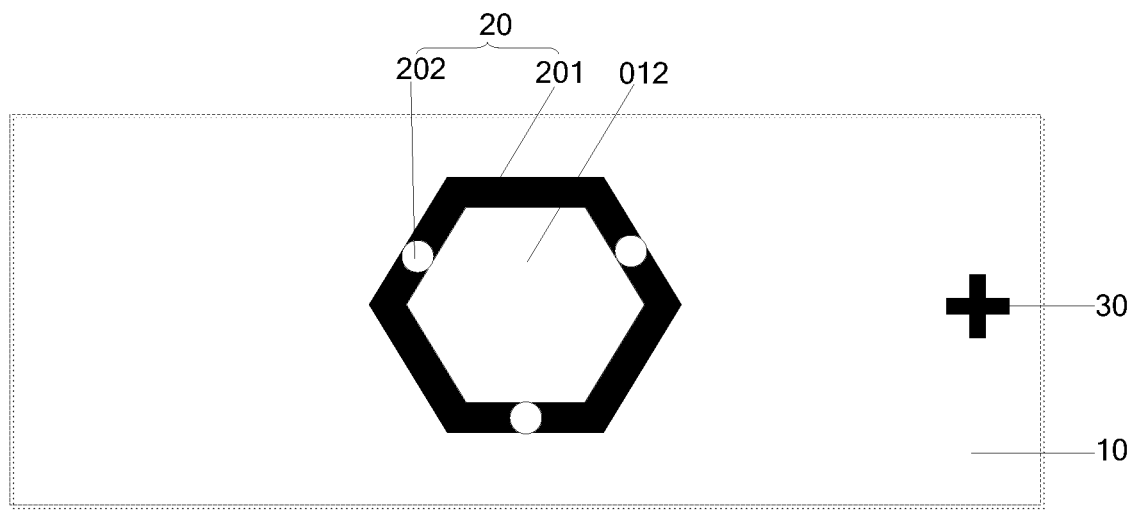
FIG. 4B is a schematic view showing a planar structure of another OLED package substrate comprising an alignment pattern and a conductor as provided by embodiments of the present disclosure.

According to another embodiment, as shown in FIG. 1, FIG. 4A and FIG. 4B, the OLED package substrate further comprises an alignment pattern 30 located in the non-display area 02. The alignment pattern 30 and the auxiliary electrode pattern 201 are located in the same layer and formed of the same material.

Figure 5:
FIG. 5 is a schematic view of forming an alignment pattern on a base substrate as provided by the prior art.

In order to ensure precise alignment of the OLED package substrate with the array substrate during the assembling process, as shown in FIG. 5, the alignment pattern 30 is usually fabricated on the OLED package substrate and the array substrate respectively. In this way, according to the alignment pattern 30, accurate alignment of the OLED package substrate with the array substrate can be ensured.

According to embodiments of the present disclosure, the OLED package substrate may be provided with an alignment pattern 30, or provided with a plurality of alignment patterns 30.

The alignment pattern 30 is generally formed of a metal material, for example, a metal such as Mo, Al, Ag, Cu and the like or an alloy. The alignment pattern 30 may generally have a thickness of 30 nm to 1000 nm. In addition, the shape of the alignment pattern 30 is not limited as long as the shape is convenient for alignment. For example, the alignment pattern 30 may be in a cross shape.

It is to be noted that, FIG. 4B only illustrates a part of the OLED package substrate, rather than the entire OLED package substrate. In addition, FIG. 4B illustrates an example in which the auxiliary electrode pattern 201 is hexagonal and encloses the sub-pixel area 012.

In this embodiment, since the alignment pattern 30 and the auxiliary electrode pattern 201 are located in the same layer and formed of the same material, the auxiliary electrode pattern 201 can be fabricated while fabricating the alignment pattern 30, thereby simplifying the manufacturing process of the OLED package substrate and improving the production efficiency.

Figure 6:
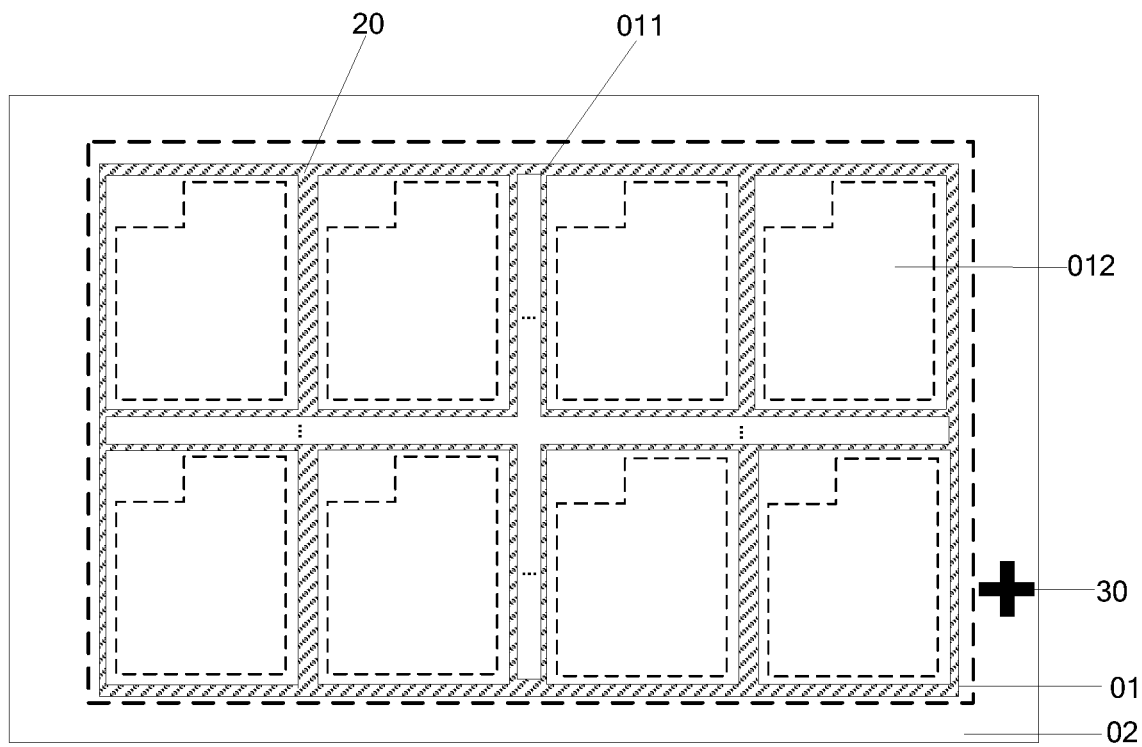
FIG. 6 is a schematic view showing a planar structure of an auxiliary electrode pattern provided by embodiments of the present disclosure.

According to another embodiment, as shown in FIG. 6, the display area 01 further comprises a plurality of sub-pixel areas 012 defined by the pixel definition area 011. The auxiliary electrode pattern 201 is of a mesh structure, and each mesh in the mesh structure corresponds to one sub-pixel area 012.

According to another embodiment, as shown in FIG. 1, the display area 01 further comprises a plurality of sub-pixel areas 012 defined by the pixel definition area 011. The auxiliary electrode pattern 201 includes a plurality of sub-auxiliary electrode patterns, each sub-auxiliary electrode pattern enclosing one sub-pixel area 012.

The shape of each mesh in the mesh structure or the shape of the sub-auxiliary electrode pattern is related to the shape of the sub-pixel area 012. Exemplarily, as shown in FIG. 4B, when the shape of the sub-pixel area 012 is a hexagon, the shape of each mesh or the shape of the sub-auxiliary electrode pattern may be a hexagon. In addition, the spacing between adjacent meshes in the mesh structure and the width of each sub-auxiliary electrode pattern are not limited. For example, the spacing between adjacent meshes in the mesh structure may be 2 μm to 1000 μm. The width of each sub-auxiliary electrode pattern may be 2 μm to 1000 μm.

In order to prevent the auxiliary electrode pattern 201 from affecting the light emitted by the sub-pixel area 012, the auxiliary electrode pattern 201 should be spaced apart from the sub-pixel area 012 by a certain distance. According to another embodiment, the distance between the auxiliary electrode pattern 201 and the sub-pixel area 012 is 3 μm.

According to the above embodiment, regardless of whether the auxiliary electrode pattern 201 is of a mesh structure and each mesh in the mesh structure corresponds to one sub-pixel area 012, or the auxiliary electrode pattern 201 includes a plurality of sub-auxiliary electrode patterns and each of the sub-auxiliary electrode patterns encloses one sub-pixel area 012, a corresponding auxiliary electrode pattern 201 can be disposed around each sub-pixel area. In this way, not only the area of the auxiliary electrode pattern 201 is increased, but also the resistance of the anode or cathode located at the surface of the array substrate can be more uniformly reduced.

Figure 7:
FIG. 7 is a schematic structural view of another OLED package substrate provided by embodiments of the present disclosure.

According to another embodiment, as shown in FIG. 7, the OLED package substrate further comprises a protective layer 40 covering the auxiliary electrode pattern 201. A via hole is disposed in the protective layer 40. The connection structure 202 comes into contact with the auxiliary electrode pattern 201 through the via hole in the protective layer 40.

The material of the protective layer 40 is not limited as long as it can seal the OLED package substrate during the assembling with the array substrate and does not affect emission of the light emitted by the light emitting layer on the array substrate. Exemplarily, the material of the protective layer 40 may be SiOx, SiNx, or a composite structure of them.

In addition, the protective layer 40 may be of a monolayer structure or a multilayer structure.

According to this embodiment, the protective layer 40 covering the auxiliary electrode pattern 201 is provided. The protective layer 40 can seal the package substrate and the array substrate when the OLED package substrate is assembled with the array substrate, thereby preventing the performance of the light emitting layer on the array substrate from being affected by entrance of oxygen or moisture.

According to another embodiment, the OLED package substrate further comprises a protective layer 40 covering the auxiliary electrode pattern 201. A plurality of via holes are disposed in the protective layer 40 over the auxiliary electrode pattern 201 that encloses each mesh. Moreover, as shown in FIG. 7, the connection structure 202 may comprise multiple connection posts, each of which comes into contact with the auxiliary electrode pattern through a corresponding via hole. The auxiliary electrode pattern 201 that encloses each mesh comes into contact with the anode or cathode at the surface of the array substrate via corresponding multiple connection posts.

According to another embodiment, the OLED package substrate further comprises a protective layer 40 covering the auxiliary electrode pattern 201. A plurality of via holes are disposed in the protective layer 40 over each sub-auxiliary electrode pattern. Moreover, the connection structure 202 comprises multiple connection posts, each of which comes into contact with a corresponding sub-auxiliary electrode pattern through a corresponding via hole. As shown in FIG. 4B, each sub-auxiliary electrode pattern is in contact with the anode or cathode at the surface of the array substrate via corresponding multiple connection posts.

Since each via hole corresponds to one connection post, the number of via holes is the same as the number of connection posts. In addition, the number of connection posts correspondingly disposed around each sub-pixel area 012 is not limited (FIG. 4B illustrates an example in which three connection posts are disposed). For example, 2 to 10 connection posts can be disposed. Accordingly, 2 to 10 via holes should be disposed in the protective layer 40.

In the above embodiment, corresponding auxiliary electrode patterns or sub-auxiliary electrode patterns around each sub-pixel area 012 are connected to the anode or cathode at the surface of the array substrate by multiple connection posts. The multiple connection posts can serve to support the package substrate.

According to another embodiment, the connection structure 202 has a height of 0.05 μm to 100 μm.

It is to be noted that, when the OLED package substrate is assembled with the array substrate, a photo spacer (PS) needs to be disposed between the OLED package substrate and the array substrate so as to maintain a certain distance between the OLED package substrate and the array substrate. In general, the separation of the OLED package substrate from the array substrate is achieved by forming a PS layer on the array substrate.

According to this embodiment, when the height of the connection structure 202 is 0.05 μm to 100 μm, the connection structure 202 itself may function as a photo spacer. Therefore, there is no need to form a PS layer on the array substrate. As a result, the manufacturing process of an OLED display device comprising the package substrate and the array substrate can be simplified.

According to another embodiment, the connection structure 202 is formed of a transparent conductive material.

For example, the connection structure 202 may be formed of a conductive resin or other conductive organic film layers.

According to this embodiment, since the connection structure 202 is formed of a transparent conductive material, the connection structure can not only connect the auxiliary electrode pattern 201 to the anode or cathode located at the surface of the array substrate, but also prevent the light emitted by the light emitting layer on the array substrate from being blocked, thereby improving the light extraction efficiency of the light emitting layer on the array substrate.

Figure 8:
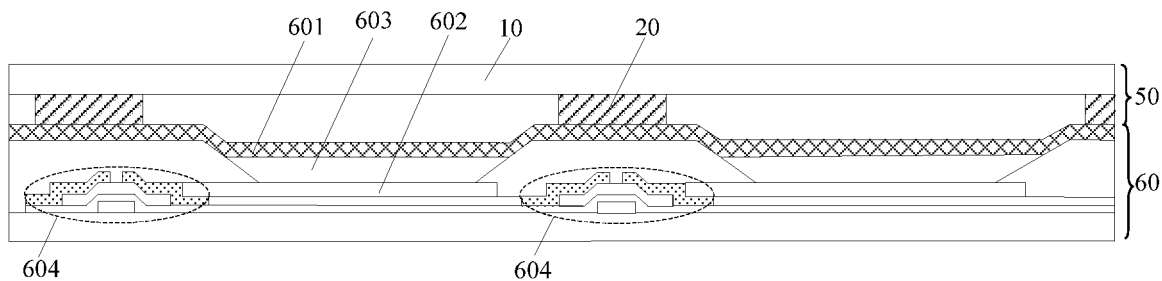
FIG. 8 is a schematic structural view of an OLED display panel provide by embodiments of the present disclosure.

According to another embodiment of the present disclosure, there is provided an OLED display panel. As shown in FIG. 8, the OLED display panel comprises a package substrate 50 and an array substrate 60 assembled with each other. The array substrate 60 comprises a cathode 601 or an anode 602 formed at its surface (FIG. 8 illustrates an example in which the array substrate 60 comprises a cathode 601 formed at its surface). The package substrate 50 is the OLED package substrate described above.

The array substrate may be a PMOLED array substrate or an AMOLED array substrate (FIG. 8 illustrates an example in which the array substrate is an AMOLED array substrate). When the array substrate is a PMOLED array substrate, the PMOLED array substrate comprises a cathode 601, an anode 602, and an organic material functional layer 603 disposed between the anode 602 and the cathode 601. When the array substrate is an AMOLED array substrate, as shown in FIG. 8, the AMOLED array substrate further comprises a thin film transistor 604 in addition to the anode 602, the cathode 601, and the organic material functional layer 603 disposed between the anode 602 and the cathode 601. The thin film transistor 604 includes a gate, a gate insulating layer, a source, a drain, and an active layer. The drain is electrically connected to the anode 602.

In this embodiment, since the conductor 20 is disposed on the base substrate 10 of the OLED package substrate, when the OLED package substrate is assembled with the array substrate 60, the conductor 20 of the OLED package substrate can contact the anode or cathode located at the surface of the array substrate 60. This gives a resistor in parallel to the anode or cathode located at the surface of the array substrate 60. As a result, the resistance of the anode or cathode located at the surface of the array substrate 60 is reduced, thereby avoiding the large power consumption caused by the anode or cathode at the surface of the array substrate. This can reduce the overall power consumption of the OLED display device and prolong the service lifetime thereof.

According to an embodiment of the present disclosure, there is further provided a method of manufacturing an OLED package substrate. The OLED package substrate comprises a display area and a non-display area. The display area includes a pixel definition area. The method of manufacturing an OLED package substrate comprises: providing a base substrate; and forming a conductor on the base substrate. A conductor is located within the pixel definition region and configured to be in contact with a cathode or an anode at a surface of an array substrate for assembly with the OLED package substrate.

According to another embodiment, the conductor comprises: an auxiliary electrode pattern; and a connection structure disposed on and in contact with the auxiliary electrode pattern. Moreover, forming a conductor on the base substrate comprises: forming a metal thin film on the base substrate, forming an auxiliary electrode pattern within the pixel definition area of the display area by patterning process, and forming a connection structure on the auxiliary electrode pattern by patterning process.

According to another embodiment, the method of manufacturing an OLED package substrate further comprises: forming an alignment pattern within the non-display area while forming the auxiliary electrode pattern within the pixel definition area of the display area by patterning process.

According to another embodiment, the method of manufacturing an OLED package substrate further comprises: after forming the auxiliary electrode pattern within the pixel definition area of the display area by patterning process and forming the alignment pattern within the non-display area, forming a protective layer over the alignment pattern and the auxiliary electrode pattern, wherein a via hole that exposes a portion of the auxiliary electrode pattern is disposed in the protective layer. Moreover, forming a connection structure on the auxiliary electrode pattern by patterning process comprises: forming a conductive thin film on the protective layer, and forming a connection structure on the auxiliary electrode pattern by patterning process. The connection structure comes into contact with the auxiliary electrode pattern through the via hole in the protective layer.

Figure 9:
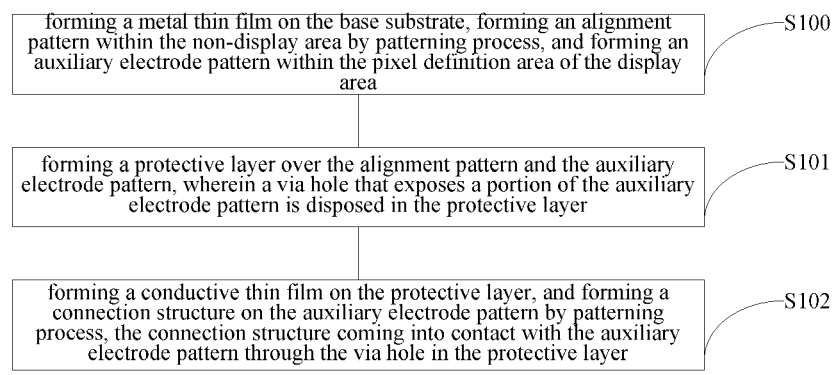
FIG. 9 is a schematic flow chart illustrating a specific example of a method of manufacturing an OLED package substrate as provided by embodiments of the present disclosure.

FIG. 9 is a schematic flow chart illustrating a specific example of a method of manufacturing an OLED package substrate as provided by embodiments of the present disclosure. The OLED package substrate comprises a display area 01 and a non-display area 02. The display area 01 comprises a pixel definition area 011. As shown in FIG. 9, the specific example of the method of manufacturing an OLED package substrate may comprise the following steps.

At S100, a metal thin film is formed on the base substrate 10, an alignment pattern 30 is formed within the non-display area 02 by patterning process, and an auxiliary electrode pattern 201 is formed within the pixel definition area 011 of the display area 01.

Here, the patterning process specifically refers to a process of coating a photoresist, exposure, development, etching, and removing the photoresist.

The material of the base substrate 10 is not limited. It should be understood by those skilled in the art that, for a top emission type OLED display device, the OLED package substrate should be transparent in order not to affect normal emission of the light emitted by a light emitting layer on the array substrate. The base substrate 10 may also be transparent. For example, the base substrate 10 may be made of glass.

In addition, the material of the metal thin film is not limited. The material of the metal thin film may be at least one selected from the group comprising a metal element, a metal oxide and an alloy.

The shapes and sizes of the formed alignment pattern 30 and auxiliary electrode pattern 201 are not limited. The shapes and sizes of the alignment pattern 30 and the auxiliary electrode pattern 201 may be set as needed. For example, the alignment pattern 30 may be in a cross shape. The shape of the auxiliary electrode pattern 201 may be, for example, a shape made up of a plurality of hexagons, a plurality of stars, a plurality of circles, or a plurality of other irregular shapes.

At S101, a protective layer 40 is formed over the alignment pattern 30 and the auxiliary electrode pattern 201, wherein a via hole that exposes a portion of the auxiliary electrode pattern 201 is disposed in the protective layer 40.

The material of the protective layer 40 is not limited as long as it can seal the OLED package substrate and the array substrate during the assembling process and does not affect emission of the light emitted by the light emitting layer on the array substrate. Exemplarily, the material of the protective layer 40 may be SiOx, SiNx, or a composite structure of them. The protective layer 40 may be a monolayer structure or a multilayer structure.

In this step, a protective thin film may be first formed on the alignment pattern 30 and the auxiliary electrode pattern 201, and then via holes are formed in the protective thin film by etching process to form the protective layer 40.

At S102, a conductive thin film is formed on the protective layer 40, and a connection structure 202 is formed on the auxiliary electrode pattern 201 by patterning process. The connection structure 202 comes into contact with the auxiliary electrode pattern 201 through the via hole in the protective layer 40.

The patterning process specifically refers to a process of coating a photoresist, exposure, development, etching, and removing a photoresist.

The size and shape of the connection structure 202 are not limited. The size and shape of the connection structure 202 may be set as needed. When the height of the connection structure 202 is 0.05 μm to 100 μm, the connection structure 202 may also serve as a photo spacer disposed between the OLED package substrate and the array substrate. The material of the connection structure 202 is not limited. For example, the connection structure 202 may be formed of a transparent conductive material.

In addition, the display area 01 further comprises, for example, a plurality of sub-pixel areas 012 defined by the pixel definition area 011. The number of via holes disposed around each of the sub-pixel areas 012 is not limited. For example, two to ten via holes may be disposed in the protective layer around each of the sub-pixel areas 012.

In the above specific example of the method of manufacturing the OLED package substrate, since the auxiliary electrode pattern 201 and the connection structure 202 in contact with the auxiliary electrode pattern 201 are disposed on the base substrate of the OLED package substrate, when the OLED package substrate is assembled with the array substrate, the connection structure 202 may contact the anode or cathode at the surface of the array substrate. This gives a resistor in parallel to the anode or cathode located at the surface of the array substrate. As a result, the resistance of the anode or cathode located at the surface of the array substrate is reduced, thereby avoiding the large power consumption caused by the anode or cathode. This can reduce the overall power consumption of the OLED display device and prolong the service lifetime of the OLED display device.

The above embodiments are only specific embodiments of the present disclosure, while the protection scope of the present disclosure is not so limited. Variations or replacements that can be easily conceived by any skilled person familiar with this technical field within the technical scope revealed by the present disclosure shall be encompassed within the protection scope of the present disclosure. Thus, the protection scope of the present disclosure shall be based on the protection scope of the attached claims.

The invention claimed is:

1. An OLED package substrate, comprising a display area and a non-display area, the display area comprising a pixel definition area, the OLED package substrate comprising:
   a base substrate; and
   a conductor on the base substrate and within the pixel definition area,
   wherein the conductor is configured to be in contact with one of a cathode and an anode at a surface of an array substrate for assembly with the OLED package substrate,
   wherein the conductor comprises: an auxiliary electrode pattern; and a connection structure which is disposed on and in contact with the auxiliary electrode pattern, the connection structure being configured to be in contact with the one of the cathode and the anode, and
   wherein the OLED package substrate further comprises an alignment pattern in the non-display area, the alignment pattern and the auxiliary electrode pattern being located in a same layer and formed of a same material.

2. The OLED package substrate according to claim 1, wherein the display area further comprises a plurality of sub-pixel areas defined by the pixel definition area, and the auxiliary electrode pattern is of a mesh structure, each mesh in the mesh structure corresponding to one sub-pixel area.

3. The OLED package substrate according to claim 2, further comprising a protective layer covering the auxiliary electrode pattern,
   wherein a plurality of via holes are disposed in the protective layer over the auxiliary electrode pattern that encloses each mesh, and
   wherein the connection structure comprises multiple connection posts, each connection post is in contact with the auxiliary electrode pattern through a corresponding via hole, and the auxiliary electrode pattern that encloses each mesh is in contact with the one of the cathode and the anode at the surface of the array substrate via corresponding multiple connection posts.

4. The OLED package substrate according to claim 1, wherein the display area further comprises a plurality of sub-pixel areas defined by the pixel definition area, and the auxiliary electrode pattern includes a plurality of sub-auxiliary electrode patterns, each sub-auxiliary electrode pattern enclosing one sub-pixel area.

5. The OLED package substrate according to claim 4, further comprising a protective layer covering the auxiliary electrode pattern,
   wherein a plurality of via holes are disposed in the protective layer over each sub-auxiliary electrode pattern, and
   wherein the connection structure comprises multiple connection posts, each connection post is in contact with a corresponding sub-auxiliary electrode pattern through a corresponding via hole, and each sub-auxiliary electrode pattern is in contact with the one of the cathode and the anode at the surface of the array substrate via corresponding multiple connection posts.

6. The OLED package substrate according to claim 1, further comprising a protective layer covering the auxiliary electrode pattern, wherein a via hole is disposed in the protective layer, and
   wherein the connection structure comes into contact with the auxiliary electrode pattern through the via hole in the protective layer.

7. The OLED package substrate according to claim 1, wherein a height of the connection structure is 0.05 μm to 100 μm.

8. The OLED package substrate according to claim 1, wherein the connection structure is formed of a transparent conductive material.

9. An OLED display panel comprising a package substrate and an array substrate assembled with each other, wherein the array substrate comprises one of a cathode and an anode formed at a surface thereof, and the package substrate is the OLED package substrate according to claim 1.

10. The OLED display panel according to claim 9, wherein the display area further comprises a plurality of sub-pixel areas defined by the pixel definition area, and the auxiliary electrode pattern is of a mesh structure, each mesh in the mesh structure corresponding to one sub-pixel area.

11. The OLED display panel according to claim 9, wherein the display area further comprises a plurality of sub-pixel areas defined by the pixel definition area, and the auxiliary electrode pattern includes a plurality of sub-auxiliary electrode patterns, each sub-auxiliary electrode pattern enclosing one sub-pixel area.

12. The OLED display panel according to claim 9, further comprising a protective layer covering the auxiliary electrode pattern, wherein a via hole is disposed in the protective layer, and
wherein the connection structure comes into contact with the auxiliary electrode pattern through the via hole in the protective layer.

13. A method of manufacturing an OLED package substrate, the OLED package substrate comprising a display area and a non-display area, the display area comprising a pixel definition area, the method comprising:
providing a base substrate; and
forming a conductor on the base substrate,
wherein the conductor is within the pixel definition area, and the conductor is configured to be in contact with one of a cathode and an anode at a surface of an array substrate for assembly with the OLED package substrate,
wherein the conductor comprises: an auxiliary electrode pattern; and a connection structure which is disposed on and in contact with the auxiliary electrode pattern,
wherein said forming a conductor on the base substrate comprises:
forming a metal film on the base substrate, and forming an auxiliary electrode pattern within the pixel definition area of the display area by patterning process; and
forming a connection structure on the auxiliary electrode pattern by patterning process, and
wherein the method further comprises: forming an alignment pattern within the non-display area while forming the auxiliary electrode pattern within the pixel definition area of the display area by patterning process.

14. The method of manufacturing an OLED package substrate according to claim 13, further comprising: after forming the auxiliary electrode pattern within the pixel definition area of the display area by patterning process and forming the alignment pattern in the non-display area, forming a protective layer over the alignment pattern and the auxiliary electrode pattern, wherein a via hole that exposes a portion of the auxiliary electrode patter is disposed in the protective layer, and
wherein said forming a connection structure on the auxiliary electrode pattern by patterning process comprises: forming a conductive film on the protective layer, and forming a connection structure on the auxiliary electrode pattern by patterning process, the connection structure being in contact with the auxiliary electrode pattern through the via hole in the protective layer.

* * * * *